(12) United States Patent
Liberkowski

(10) Patent No.: US 6,506,981 B1
(45) Date of Patent: Jan. 14, 2003

(54) INTERCONNECT STRUCTURE HAVING FUSE OR ANTI-FUSE LINKS BETWEEN PROFILED APERTURES

(76) Inventor: Janusz B. Liberkowski, 5884 Macadam Ct., San Jose, CA (US) 95123

( * ) Notice: Subject to any disclaimer, the term of this patent is extended or adjusted under 35 U.S.C. 154(b) by 0 days.

(21) Appl. No.: 09/721,379

(22) Filed: Nov. 22, 2000

(51) Int. Cl.$^7$ .............................................. H01R 9/09
(52) U.S. Cl. ..................... 174/262; 174/261; 174/263; 361/803
(58) Field of Search ................... 174/261, 262, 174/263, 264, 265, 266; 361/784, 792, 803

(56) References Cited

U.S. PATENT DOCUMENTS

| | | | |
|---|---|---|---|
| 4,498,122 A | 2/1985 | Rainal | 364/414 |
| 4,764,846 A | 8/1988 | Go | 361/388 |
| 4,888,665 A | 12/1989 | Smith | 361/400 |
| 4,899,439 A | 2/1990 | Potter et al. | 29/846 |
| 4,983,533 A | 1/1991 | Go | 437/7 |
| 5,128,831 A | 7/1992 | Fox, III et al. | 361/396 |
| 5,264,664 A | 11/1993 | McAllister et al. | 174/261 |
| 5,266,833 A | 11/1993 | Capps | 257/690 |
| 5,373,109 A | 12/1994 | Argyrakis et al. | 174/117 |
| 5,434,745 A | 7/1995 | Shokrgozar | 361/735 |
| 5,455,445 A | 10/1995 | Kurtz et al. | 257/419 |
| 5,468,997 A | 11/1995 | Imai et al. | 257/734 |
| 5,481,133 A | 1/1996 | Hsu | 257/621 |
| 5,481,134 A | 1/1996 | Sobhani et al. | 257/686 |
| 5,572,409 A | * 11/1996 | Nathan et al. | 361/806 |
| 5,623,160 A | * 4/1997 | Liberkowski | 257/621 |
| 5,640,308 A | * 6/1997 | Osann, Jr. et al. | 361/777 |
| 5,691,209 A | 11/1997 | Liberkowski | 437/7 |
| 5,789,764 A | 8/1998 | McCollum | 257/76 |
| 5,973,396 A | * 10/1999 | Farnworth | 257/698 |
| 6,191,486 B1 | * 2/2001 | Bernstein | 257/776 |

OTHER PUBLICATIONS

Steve Chiang et al.; "Antifuse Structure Comparison for Field Programmable Gate Arrays", IEEE, IEDM, 1992, pp. 611–614.
S. S. Cohen et al.; "A Flat–Aluminum Based Voltage–Programmable Link for Field–Programmable Devices", IEEE Translations on Electronic Devices, vol. 41, No. 5, May 1994, pp. 721–724.
Chenming Hu; "Interconnect Devices for Field Programmable Gate Array", 1992, IEEE, IEDM, pp. 591–594.
Y. Pauleau; "Interconnect Materials for VLSI Circuits", Solid State Technology, vol. 30, Apr. 1987, pp. 155–162.
D. B. Tuckerman; "Laminated Memory: A New 3–Dimensional Packaging Technology for MCMs", proceedings of 1994 IEEE, Multichip Module Conference, pp. 58–63.

* cited by examiner

Primary Examiner—Albert W. Paladini
(74) Attorney, Agent, or Firm—Lumen Intellectual Property Services, Inc.

(57) ABSTRACT

An interconnect structure with an interconnect stack consisting of a number of alternating conductive planes and insulating planes. The stack has a number of conductive elements such as conductive vias extend generally normal to the conductive insulating planes of the stack and a number of profiled apertures having geometrical shapes such that they define fuse links in one or more of the conductive planes. The fuse links have a steeply narrowed waist, such that a fusing current $I_f$ passing through the fuse link produces a fused break substantially at the steeply narrowed waist. Profiled apertures can also be used to define anti-fuse links in interconnect structures such that passing an anti-fusing current $I_{a-f}$ through the anti-fuse link produces a fused joint substantially at the steeply narrowed waist.

10 Claims, 6 Drawing Sheets

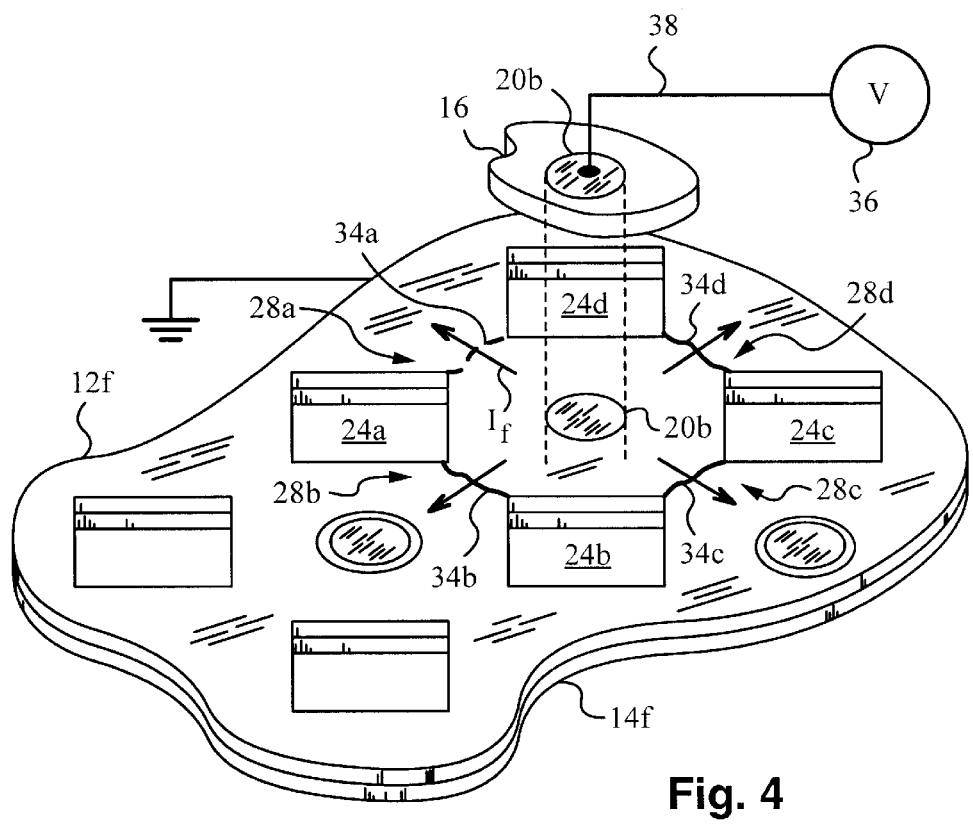
Fig. 4
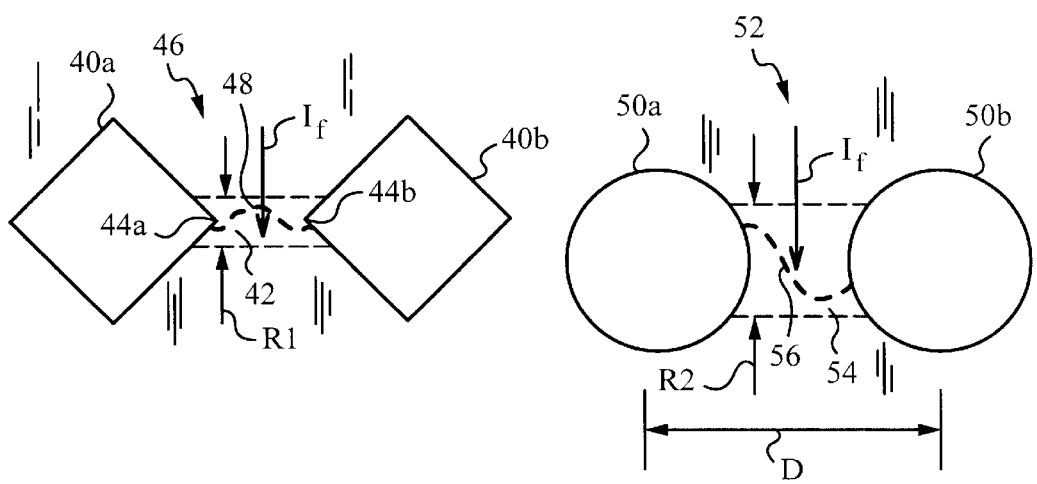
Fig. 5A
Fig. 5B
PRIOR ART

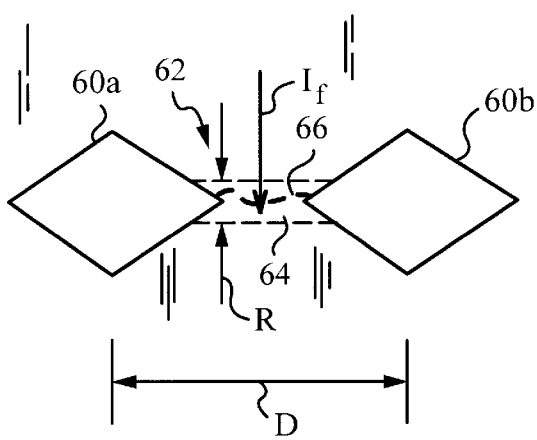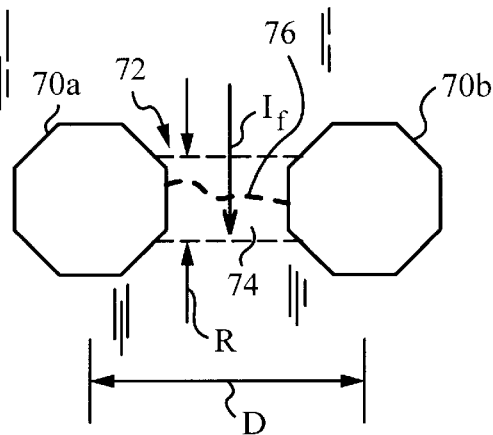
Fig. 6A　　　　　　　　Fig. 6B
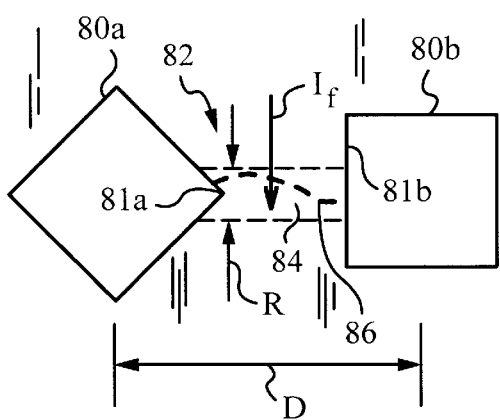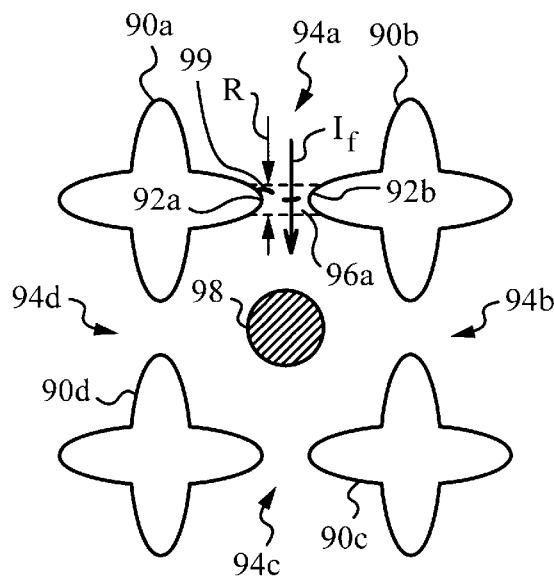
Fig. 6C　　　　　　　　Fig. 6D

INTERCONNECT STRUCTURE HAVING FUSE OR ANTI-FUSE LINKS BETWEEN PROFILED APERTURES

FIELD OF THE INVENTION

This invention relates generally to electronic interconnect structures, and in particular to interconnect stacks with fuse or anti-fuse links defined between profiled holes.

BACKGROUND OF THE INVENTION

Electronic interconnect structures are known in the art. In their simplest form, these interconnect structures are embodied by printed circuit boards (PCBs) or printed wiring boards (PWBs). These types of boards use conductive traces or wire conductors to transmit electronic signals. One common application of PCBs and PWBs is in routing signals to and from electronic circuits and integrated circuits (ICs) in particular. In traditional PCBs the traces are provided in one or two planes; the top and bottom surfaces of the PCB. The number of traces which can be printed on a surface is limited by factors such as signal cross talk, current density and ohmic heating. Hence, traditional PCBs can only support a few hundred interconnections in PCBs of modest size and packing density.

More recently, multi-layered printed circuit boards (PCBs) have been employed to extend the number of interconnects by using several planes of traces. The planes are separated by dielectrics. Electrical connections between the planes are usually provided by vertical metal pillars or conductive vias.

Further information about multi-layered PCBs can be found in U.S. Pat. No. 4,498,122 entitled "High-Speed, High Pin-Out LSI Chip Package" and other open literature.

Multichip modules (MCMs) are packages with high density substrates (finer than 100 $\mu$m lines and spaces) and bare die (usually more than five). MCM is the current method used to interconnect multiple dice without adding substantial overhead in terms of volume and reliability.

The prior art also teaches more advanced interconnect structures in which interconnections can be programmed by establishing or breaking electrical connections. For example, U.S. Pat. No. 4,888,665 entitled "Customizable Circuitry", discloses interconnect circuits using orthogonally extending multi-wire layers adjacent ones of which can be fused and anti-fused as necessary to program interconnect nodes. Further teachings on multi-layered interconnect structures can be found in U.S. Pat. No. 4,899,439 entitled "Method of Fabricating a High Density Electrical Interconnect"; U.S. Pat. No. 5,264,664 entitled "Programmable Chip to Circuit Board Connector".

Multi-layered interconnect structures have also been used in flexible electrical wiring cables, as taught by U.S. Pat. No. 5,373,109 entitled "Electrical Cable Having Flat, Flexible, Multiple Conductor Sections". It has also been recognized that it may be desirable, in certain applications to enhance component density by laterally stacking vertically oriented die or die-support substrates and providing for an edge connect. For information on such laterally stacked structures the reader is referred to U.S. Pat. Nos. 5,266,833; 4,983,533 and 4,764,846. Furthermore, it has been recognized that it may be desirable, in certain applications, to vertically stack horizontally-disposed dice in two or more layers. The reader is referred to U.S. Pat. Nos. 5,481,134; 5,481,133; 5,468,997; 5,455,445; 5,434,745 and 5,128,831 for a review of these teachings.

In U.S. Pat. Nos. 5,623,160 and 5,691,209 the present inventor discloses a signal-routing or interconnect substrate, structure and apparatus. The lattice is preferably formed in a plural-layer structure, whereby each required interconnect signal has one or more dedicated layers of a planar, thin-film conductor that is coextensive with the substrate. An array of vertical pillars or conductive vias is provided in the substrate, each pillar effectively providing an inner conductor either electrically connected with a conductive layer or electrically insulated therefrom by an insulative region. The pillars can be selectively connected or disconnected from the conductive layers by fusing and anti-fusing techniques.

Increasing density of ICs, whose linewidths (i.e., widths of conductive traces and pins) are constantly shrinking, have made current density a major concern in dense interconnect structures. Corresponding improvements to interconnect structures are documented in U.S. Pat. No. 5,969,321 to Smooha, who teaches how to avoid current crowding in a multi-layered interconnect structure by using two sets of separated vias. As well as in U.S. Pat. No. 5,973,396 to Farnworth who discloses an interconnect structure or die in which there can be vertical and horizontal fuse elements. Farnworth's die permits one to decrease the die size or shrink the die stack.

Continuing increases in IC densities and reductions in die real estate demand further down-scaling and improvements to interconnect structures. Applications of interconnect stacks in fields other than pin-out of ICs place additional demands. For example, interconnect stacks have been proposed for use in memories. For further information the reader is referred to "Laminated Memory: A New 3-Dimensional Packaging Technology for MCMs", proceedings of 1994 IEEE, Multichip Module Conference, pp. 58–63.

Several prior art approaches have focused on antifuse structures and materials. For example, U.S. Pat. No. 5,789,764 to McCollum teaches an antifuse material having a thickness designed to impart a desired target programming voltage to the antifuse. The antifuse can be used in via antifuses or stacked antifuses. Additional teaching on antifuse structures can be found in Chiang, "Antifuse Structure Comparison for Field Programmable Gate Arrays", IEEE, IEDM, 1992, pp. 611–614; Cohen, "A Flat-Aluminum Based Voltage-Programmable Link for Field-Programmable Devices", IEEE Translations on Electronic Devices, vol. 41, No. 5, May 1994, pp. 721–724; Hu, "Interconnect Devices for Field Programmable Gate Array", 1992, IEEE, IEDM, pp. 591–594; and Pauleau, "Interconnect Materials for VLSI Circuits", Solid State Technology, vol. 30, April 1987, pp. 155–162.

As a result of the advances made with wafer fabrication, today's semiconductor chips are smaller, run at a higher frequency, generate more heat and require more interconnections due to increased complexity. The rapid increase in input/output (I/O) and space limitation requirements of new packaging place difficult demands on the interconnect density and electrical performance of package substrates. In chip-scale, area-array methods, a small form factor is needed, and there is no mechanism to accommodate the transition from the chip's I/O density to the board's density. Silicon shrinkage, advances in design tools, system architecture and package assembly have all driven higher densities. Bump pitch decreases for high-I/O-count packaging and shorter development cycles are pushing substrate suppliers to meet the new requirements.

Because packaging interconnect technology has not kept pace with the developments of the fabrication process and chip design, the current techniques for package interconnections are expensive and therefore prohibitive to mainstream applications. Presently, interconnection technology, or the lack thereof, is viewed as the major bottleneck in creating new electronic devices with higher performance, faster time-to-market, and lower costs.

Despite the various teachings related to MCM structures, further down-scaling remains a difficult task. It would be an advance in the art to provide an interconnect structure with fuse or antifuse type links which are more sensitive and permit further down-scaling of the interconnect structure. Specifically, it would be an advance in the art to develop more accurately and precisely controllable fuse and anti-fuse links in such interconnect structures.

OBJECTS AND ADVANTAGES OF THE INVENTION

Accordingly, it is a primary object of the present invention to provide an interconnect structure in the form of an interconnect stack having more precisely controlled fuse and/or anti-fuse links. In particular, it is an object of the invention to provide fuse and anti-fuse links which more accurately and precisely define the locations at which the fuse and anti-fuse processes take place, thereby allowing for further down-scaling of the interconnect stack.

These and other objects and advantages will be apparent upon reading the following description and accompanying drawings.

SUMMARY OF THE INVENTION

These objects and advantages are attained by an interconnect structure in the form of an interconnect stack consisting of a number of conductive planes and a number of insulating planes alternatingly disposed between the conductive planes. A number of conductive elements such as conductive vias extend generally normal to the conductive planes and insulating planes of the stack. The stack also has a number of profiled apertures which also extend generally normal to the conducting and insulating planes of the stack.

In one embodiment, the profiles apertures have appropriately selected geometrical shapes such that they define fuse links in one or more of the conductive planes. The fuse links have a steeply narrowed waist, such that a fusing current $I_f$ passing through the fuse link produces a fused break substantially at the steeply narrowed waist. In other words, the fusing process occurring in the fuse links is localized to their steeply narrowed waist.

In one group of embodiments it is convenient for the profiled apertures to have corners. This can be accomplished by selecting the profiles of the apertures from among geometrical shapes including squares, rectangles and hexagons or any other geometrical shapes with corners. The profiled apertures are arranged such that the steeply narrowed waists of the fuse links are located substantially between two of the corners. In other words, the two corners of two adjacent apertures can be used to define the waist of each fuse link. Preferably, the steeply narrowed waist has a minimum width ranging from 100 Å to 1 mm.

In another group of embodiments, the profiled apertures have corners and edges and the steeply narrowed waist is located between at least one of the corners and at least one of the edges. Again, the profiles can be selected from among the same geometrical shapes as mentioned above. In this case, however, the adjacent apertures are placed in such that the corner of one approaches the edge of another at the steeply narrowed waist. The waist has a minimum width ranging from 100 Å to 1 mm.

In another embodiment, the profiled apertures have oval portions. In this embodiment the waist is preferably located between oval portions having a small radius of curvature.

In some cases it is convenient to associate a set of profiled apertures with each conductive via. For example, a set of four apertures can be associated with each conductive via. This association can be exclusive, in other words, the set of apertures associated with the one conductive via forms fuse links only around that one conductive via.

The interconnect structure of the invention can also be used with interconnect stacks with anti-fuse links. In this case, the apertures define anti-fuse links around the conductive vias and the steeply narrowed waist localizes the location of a fused joint. Specifically, passing an anti-fusing current $I_{a-f}$ through the anti-fuse link produces a fused joint substantially at the steeply narrowed waist.

Once again, the profiles of the profiled apertures can be selected from among the same geometrical shapes as mentioned above the waists of the anti-fuse links can be located between corners or corners and edges of adjacent apertures. Furthermore, sets of apertures can be associated exclusively or non-exclusively with each conductive via to define, e.g., four anti-fuse links around each via.

The details of the invention are explained in the below detailed description with reference to the attached drawing figures.

DESCRIPTION OF THE FIGURES

FIG. 4 is a partial isometric view illustrating the passage of fusing current through fusible links in a conductive plane.

FIG. 5A is a top plan view of a fusible link located between two profiled apertures in accordance with the invention.

FIG. 5B is a top plan view of a fusible link in the prior art.

FIGS. 6A–D are top plan views of alternative profiled apertures in accordance with the invention.

DETAILED DESCRIPTION

Figure 1:
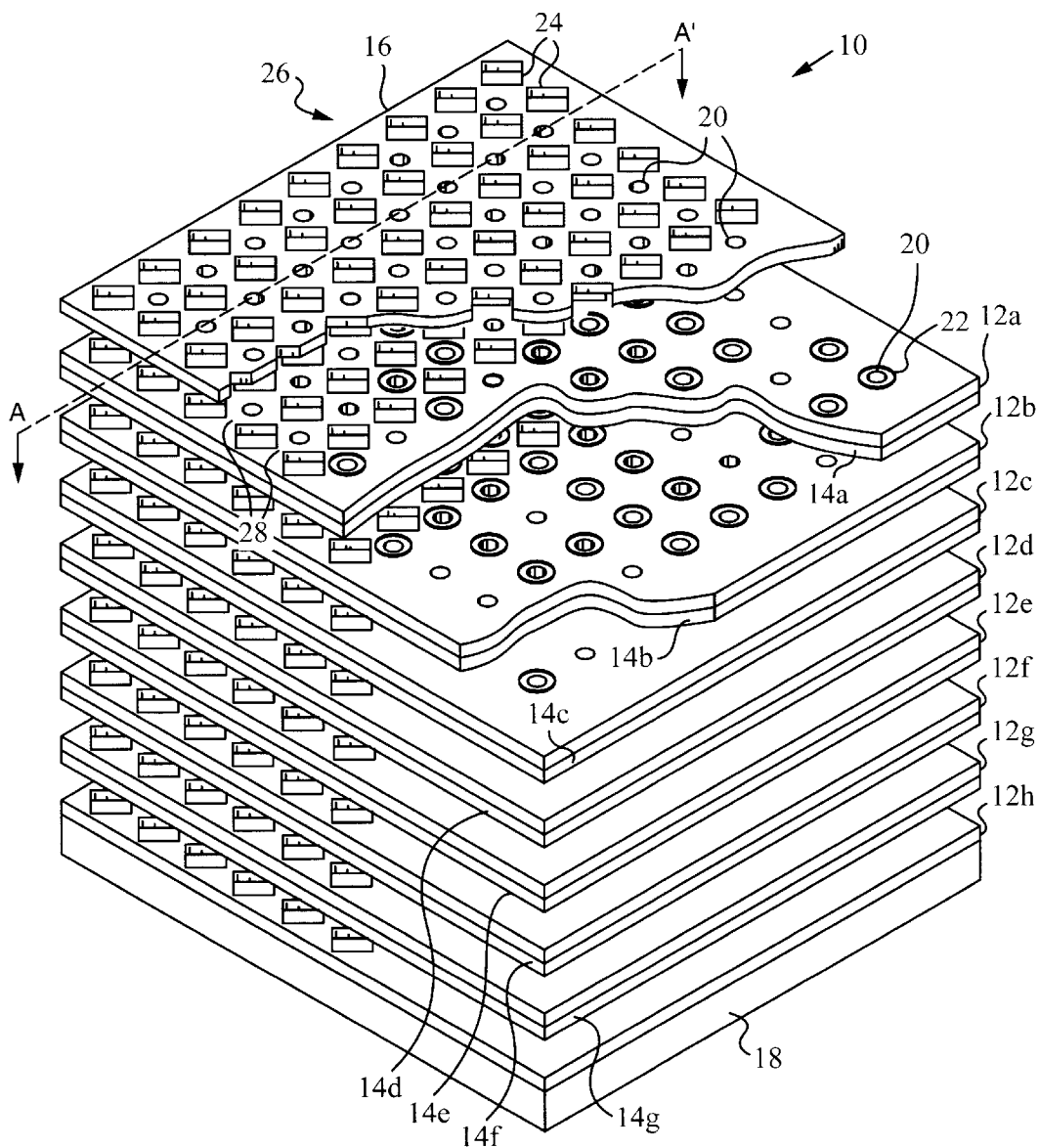
FIG. 1 is an isometric and exploded view of an interconnect stack in accordance with the invention.

FIG. 1 illustrates an isometric and exploded view of an interconnect structure in the form of an interconnect stack 10 with a number of conductive planes 12a, 12b, 12c, 12d, 12e, 12f, 12g and 12h. Each one of conductive planes 12a–h is disposed next to an associated insulating plane 14a–g. Thus, conductive planes 12a–h and insulating planes 14a–g form a layered structure of alternating conductive and insulating layers.

The layered structure of conductive and insulating planes 12a–h, 14a–g is sandwiched between a top plane 16 and a bottom or support plane 18. Both top plane 16 and support plane 18 are insulating. Insulating planes 14a–g are made of any appropriate insulating or dielectric material capable of electrically insulating conductive planes 12a–h from each other. Top plane 16 can be made of the same insulating material as insulating planes 14a–g or a different insulating material, depending on specific design requirements e.g., structural strength requirements. Similarly, support plane 18 can also be made of the same insulating material as insulating planes 14a–g or of a different insulating material.

Conducting planes 12a–h in this case can be made of a suitable conductive metal such as copper or tungsten, or any other suitable conductive material. Furthermore, the conductive material of conducting planes 12a–h should be selected to permit fusing the material to render it non-conducting at a fused break, as further discussed below. The fused break can be due to burning through of the conductive material or a change in its material structure.

Figure 2:
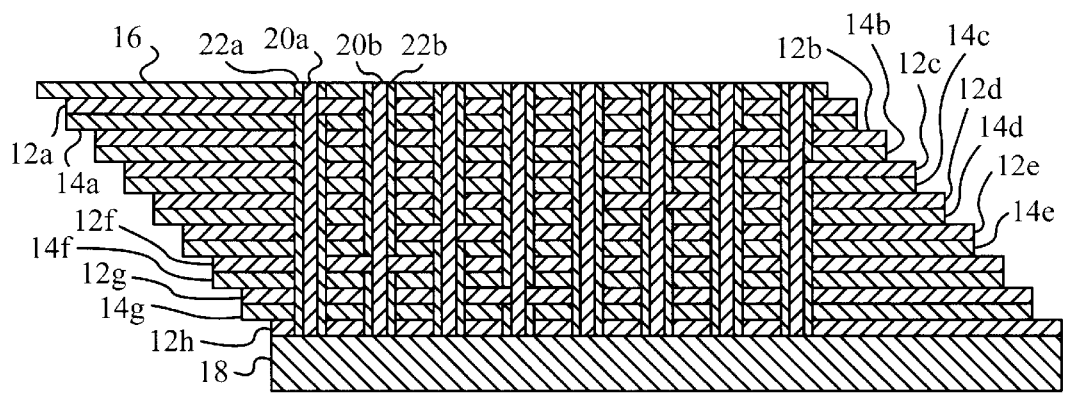
FIG. 2 is a cross sectional view of the interconnect stack of FIG. 1 illustrating the electrical connections between conductive vias and conductive planes.

A number of vias 20 are formed in stack 10. Vias 20 are generally perpendicular or normal to conductive and insulating planes 12a–h, 14a–g of stack 10 and pass through all of them. Additionally, vias 20 pass through top plane 16 and they terminate at bottom plane 18, as better seen in the cross sectional view of stack 10 afforded by FIG. 2. In fact, vias 20 are plated through with a conductive material, e.g., a metal such as copper or tungsten and are thus conductive. Some conductive vias 20 are surrounded by an insulating sheath 22 at some of the conducting planes 12a–h and not at others. For example, conductive via 20a has its insulating sheath 22a removed at conductive plane 12a, while conductive via 20b has its insulating sheath 22b removed at conductive plane 12f. Thus, an electrical connection can be established between conductive plane 12a and via 20 while no electrical connection with via 20a can be established at any other conductive plane. Similarly, an electrical connection can be established between via 20b and conducting plane 12f.

Although the use of insulating sheaths 22 around vias 20 is not necessary, the sheaths are helpful in exercising control over whether any particular via 20 can be electrically connected to any particular conducting plane. In general, the designer will be able to determine which vias 20 should be provided with insulating sheaths 22 in any particular plane of conducting planes 12a–h. This choice will depend on the electrical connections to be established in stack 10, as will be explained in more detail below.

Referring again to FIG. 1, stack 10 has a number of profiled apertures 24 passing generally perpendicular or normal to stack 10. For reasons of clarity, not all apertures 24 passing through stack 10 are shown. Apertures 24 also pass through top plane 16 and terminate at bottom surface 18. In this embodiment, apertures 24 have a square profile and are arranged in a regular pattern 26 to define fuse links 28 in conductive planes 12a–h around conductive vias 20.

Figure 3:
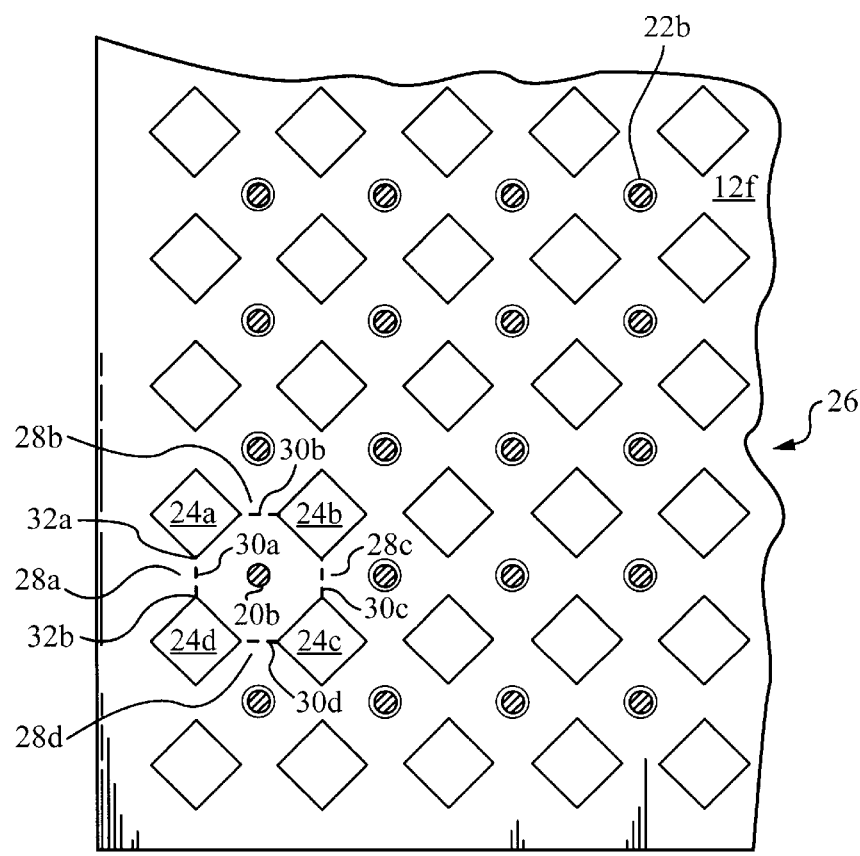
FIG. 3 is a top plan view of one conductive plane with profiled apertures according to the invention.

FIG. 3 is a top view of a portion of conductive plane 12f better illustrating fuse links 28a, 28b, 28c, 28d defined around conductive via 20b. Pattern 26 of apertures 24a, 24b, 24c and 24d is selected such that fuse links 28a, 28b, 28c, 28d steeply converge or narrow down to passages or waists 30a, 30b, 30c and 30d respectively. Thus, fuse link 28a and in particular its waist 30a located between corners 32a, 32b of apertures 28a and 28d narrows down very rapidly thanks to the square profile of apertures 28a, 28d. The same is the case for remaining fuse links 28b, 28c, 28d around via 20b, and, in fact, for all remaining vias 20 and links 28.

Electrical connections between conductive vias 20 and conducting planes 12 are made by passing a fusing current $I_f$ across fuse links 28. The fusing current is high enough for electrically separating a particular via 20 from the remainder of the conducting plane. The principles of this process and one way of passing fusing current $I_f$ across fuse links 28 are explained in FIG. 4 taking as an example conductive via 20b.

Specifically, all electrical connection between conductive via 20b and conducting plane 12f is to be broken. For this purpose, a voltage source 36 is connected by appropriate electrical connection 38, conveniently a conductor with a contacting pin or the like, to conductive via 20b. At the same time, conducting plane 12f is electrically grounded.

The application of voltage V from source 36 causes fusing current $I_f$ to flow through conductive via 20b and fuse links 28a, 28b, 28c, 28d to ground. The flow of fusing current $I_f$ through steeply narrowed waists 32a, 32b, 32c, 32d of links 28a, 28b, 28c, 28d causes ohmic heating. As a result of this heating, fused breaks 34a, 34b, 34c and 34d are produced in the material of conducting plane 12f around via 20b. In particular, fused breaks 34a, 34b, 34c and 34d are produced in fuse links 28a, 28b, 28c, 28d substantially at waists 32a, 32b, 32c, 32d. This is because the ohmic heating is highest and the material of plane 12f is most susceptible to fusing or burning through at waists 32a, 32b, 32c, 32d.

Depending on the size of interconnect stack 10, steeply narrowed waists 32a, 32b, 32c, 32d should have a minimum width ranging from 100 Å to 1 mm. The voltage V can range between 3 and 200 Volts to establish a fusing current $I_f$ ranging between 50 mA to 500 mA. In any specific case, a person skilled in the art will chose the appropriate parameters based on the design and size of interconnect stack 10.

Thus, interconnect stack 10 has precisely controlled fuse links 28 which permit the user to establish the desired electrical interconnections between vias 20 and conductive planes 12 to achieve a high level of localization of the fused breaks. This highly accurate and precise localization of fused breaks makes it possible to make interconnect structure 10 smaller by spacing vias 20 more densely. In addition, fuse breaks in stack 10 occur faster and lower amounts of heat are generated in producing them. This also means less thermal damage to stack 10, lower outgassing of fuse material and overall lower probability of damage to stack 10.

For comparison purposes, FIG. 5A illustrates a fuse link 46 between two profiled apertures 40a, 40b having square profiles according to the invention. Steeply narrowed waist 42 between corners 44a, 44b of apertures 40a, 40b defines a region R1 within which fusing current $I_f$ causes fused break 48 to occur. The distance between apertures 40a, 40b is D. FIG. 5B illustrates two apertures 50a, 50b in accordance with prior art separated by the same distance D. A fuse link 52 between apertures 50a, 50b does not have a steeply narrowed waist. Instead, apertures define a waist 54 and a region R2 within which a fused break 56 is produced by fusing current $I_f$. Clearly, waist 54 is considerably larger than waist 42. Hence, region R2 within which fused break 56 occurs is much larger than region R1. In a typical situation the width of region R1 may be 5 $\mu$m, whereas the width of region R2 in the prior art may be 20 $\mu$m or more. This improvement is in large part due to the larger current density achieved in waist 42 in comparison to waist 56.

FIGS. 6A–D illustrate alternative forms of profiled apertures which can be used to define fuse links. In particular, FIG. 6A illustrates two profiled apertures 60a, 60b defining a fuse link 62 with a steeply narrowed waist 64. Once again, profiled apertures 60a, 60b are separated by distance D. The profiles of apertures 60a, 60b are rhombic and thus waist 64 narrows down even more steeply than in the previous embodiment where the profiled apertures are square. Consequently, the region R to which a fuse break 66 is restricted is very small.

FIG. 6B shows hexagonal apertures 70*a*, 70*b* separated by distance D and defining a fuse link 72 with a steeply narrowed waist 74. A fuse break 76 occurs in this embodiment within region R. FIG. 6C illustrates yet another embodiment with square apertures 80*a*, 80*b* separated by distance D and producing a steeply narrowed waist 84. Because of the relative positioning of apertures 80*a*, 80*b* waist 84 of a fuse link 82 is located between a corner 81*a* and an edge 81*b* of apertures 80*a*, 80*b*. Thus, a fuse break 86 occurs within region R.

FIG. 6D illustrates a conductive via 98 surrounded by four profiled apertures 90*a*, 90*b*, 90*c* and 90*d* with profiles having oval portions and defining fuse links 94*a*, 94*b*, 94*c*, 94*d*. Specifically, oval portions 92*a*, 92*b* of apertures 90*a*, 90*b* approach to produce between them a steeply narrowed waist 96*a* in fuse link 94*a*. A fuse break 99 is limited to region R of waist 96*a* in this embodiment. In view of the above embodiments, it will be clear to a person skilled in the art that many geometrical shapes represent suitable profiles for profiled apertures. It will also be clear that the relative positioning of the profiles should be chosen appropriately to produce steeply narrowed waists in the fuse links.

Figure 7:
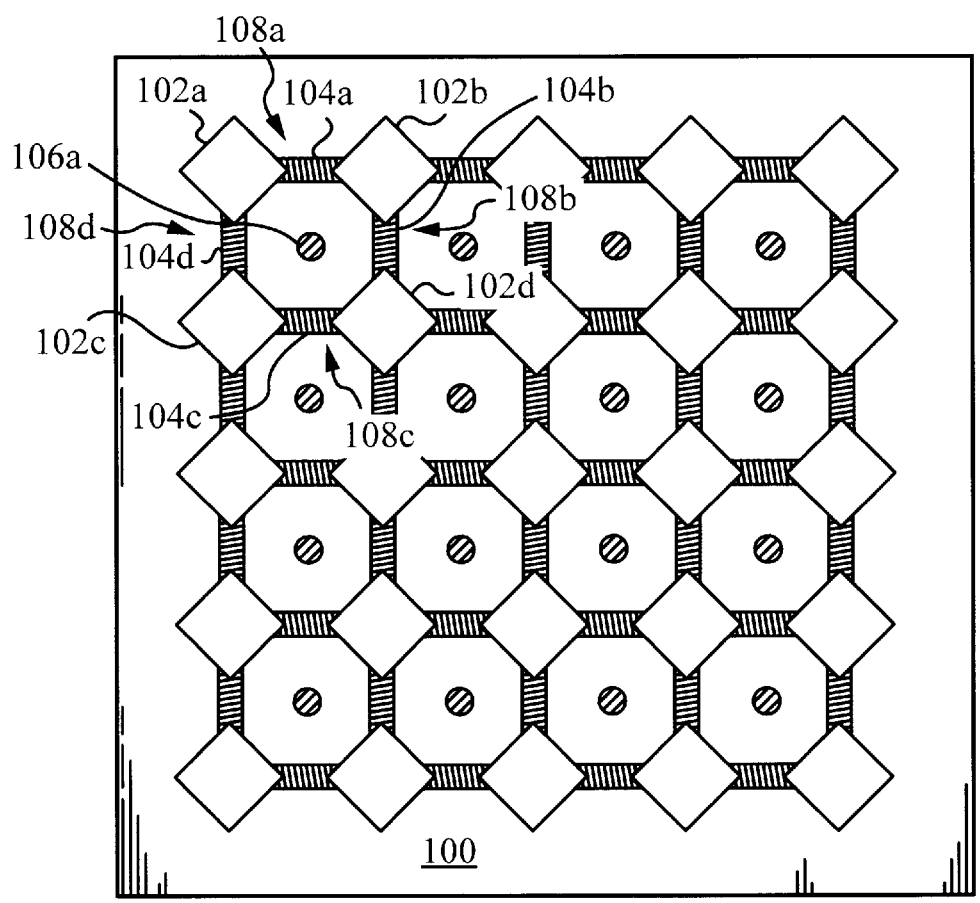
FIG. 7 is a top plan view of one conductive plane in an interconnect stack with anti-fuse links.

Profiled apertures can also be used to define anti-fuse links at steeply narrowed waists. FIG. 7 illustrates an embodiment in which a conductive plane 100 has profiled apertures 102. Specifically, apertures 102*a*, 102*b*, 102*c*, 102*d* define anti-fuse links 108*a*, 108*b*, 108*c*, 108*d* with corresponding waists 104*a*, 104*b*, 104*c*, 104*d* around a conductive via 106*a*. An anti-fuse material, indicated by hatching, is present in waists 104*a–d*. The passing of an anti-fuse current $I_{a-f}$ through anti-fuse links 108*a–d* causes the anti-fuse material to become electrically conductive. Consequently, fused joints form substantially at waists 104*a–d*. As in the previous embodiments, various profiles and relative positioning of profiled apertures can be used in interconnect structures with anti-fuse links.

Figure 8A:
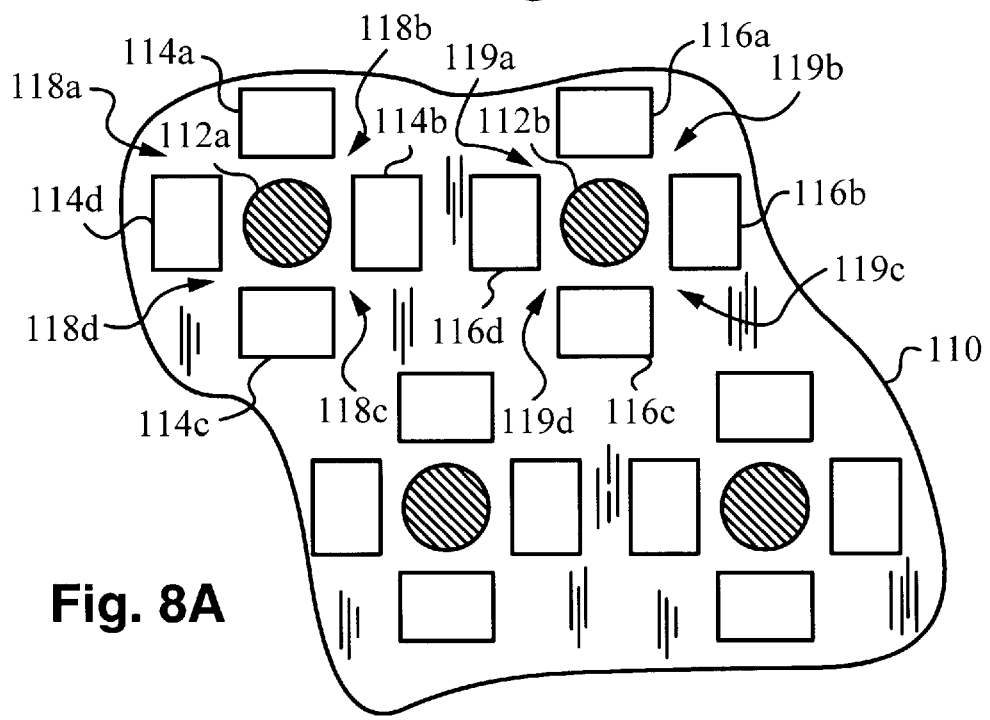
FIGS. 8A–B are top plan views illustrating the assignments of sets of profiled apertures to individual conductive vias in a conductive plane.
Figure 8B:
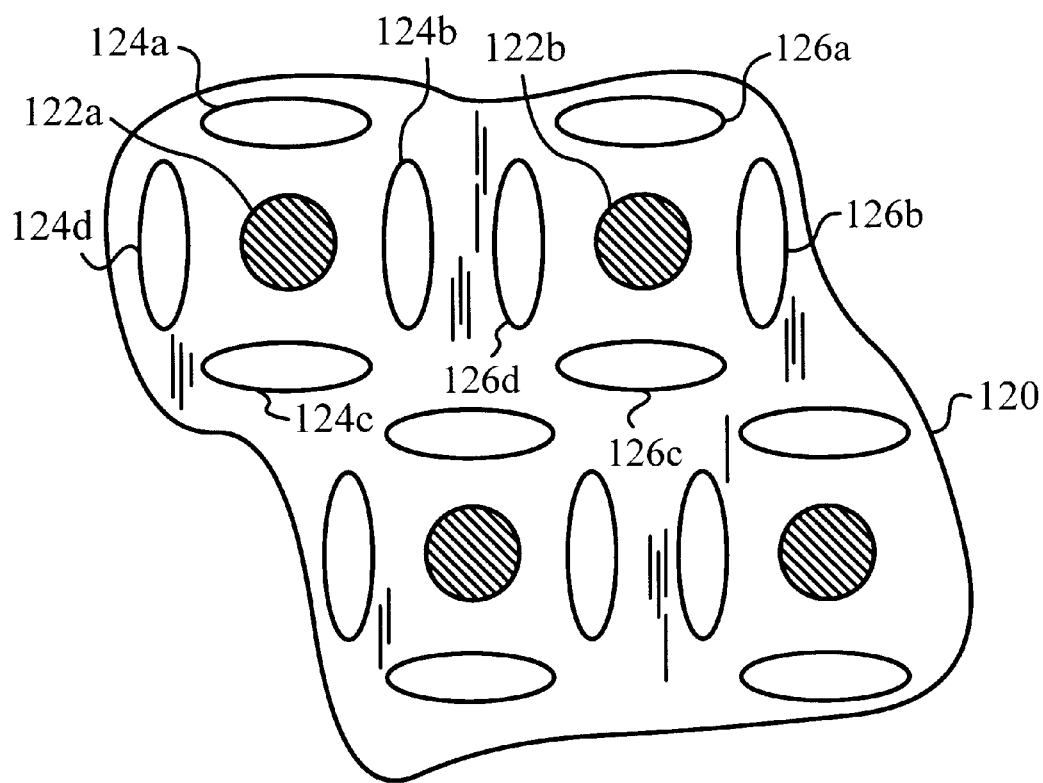

In accordance with yet another embodiment shown in FIG. 8A, a conductive plane 110 uses sets of profiled apertures to define fuse links around each conductive via. Specifically, conductive vias 112*a* and 112*b* each have assigned to them a set of rectangular profiled apertures 114*a–d* and 116*a–d* respectively. Fuse links 118*a–d* around via 112*a* are defined exclusively by the set of apertures 114*a–d*. Similarly, fuse links 119*a–d* are defined exclusively by the set of apertures 116*a–d*. It should be noted that each set of the apertures forms fuse links only around one via, in distinction to the embodiments described above. FIG. 8B, illustrates yet another embodiment in which sets of profiled apertures have elliptical profiles. In this case conductive vias 122*a*, 122*b* in conductive plane 120 are each surrounded by a set of profiled apertures 124*a–d* and 126*a–d* respectively.

The advantage of not re-using apertures for forming fuse-links around vias is that a current path remains open between electrically isolated vias after the fuse breaks are produced. This makes it easier to produce the desired interconnections. A person skilled in the art will recognize that assigning sets of profiled apertures to each via and not re-using apertures can also be practiced in interconnect structures anti-fuse links.

Interconnect structures in accordance with the invention, whether equipped with fuse or anti-fuse joints, can be used in applications requiring electrical interconnections. These can include but are not limited to establishing input/output connections to integrated circuits and electrical memory devices. In any case, the desired interconnections are programmed by the designer by passing suitable fuse or anti-fuse currents, depending on the type of links employed in the particular interconnect structure.

It will be clear to one skilled in the art that the above embodiment may be altered in many ways without departing from the scope of the invention. For example, various profiles of apertures can be used in the same interconnect structure.

Accordingly, the scope of the invention should be determined by the following claims and their legal equivalents.

What is claimed is:

1. An interconnect stack comprising:
   a) a plurality of conductive planes;
   b) a plurality of insulating planes alternatingly disposed between said conductive planes;
   c) a plurality of conductive vias extending generally normal to said conductive planes and said insulating planes;
   d) a number of profiled apertures extending generally normal to said conductive planes and said insulating planes, said profiled apertures defining fuse links in said conductive planes, each of said fuse links having a steeply narrowed waist, such that a fusing current If passing through said fuse link produces a fused break substantially at said steeply narrowed waist.

2. The interconnect of claim 1, wherein said profiled apertures comprise corners and said steeply narrowed waist is located substantially between two of said corners.

3. The interconnect of claim 2, wherein said steeply narrowed waist has a minimum width ranging from 100 Å to 1 mm.

4. The interconnect of claim 1, wherein said profiled apertures comprise corners and edges, said steeply narrowed waist is located between at least one of said corners and at least one of said edges.

5. The interconnect of claim 4, wherein said steeply narrowed waist has a minimum width ranging from 100 Å to 1 mm.

6. The interconnect of claim 1, wherein said profiled apertures have profiles selected from the group consisting of squares, rectangles and hexagons.

7. The interconnect of claim 1, wherein said profiled apertures have profiles comprising oval portions.

8. The interconnect of claim 1, wherein a set of profiled apertures of said number of profiled apertures defines said fuse links around one conductive via of said plurality of conductive vias.

9. The interconnect of claim 8, wherein said set of profiled apertures comprises four profiled apertures.

10. The interconnect of claim 8, wherein said set of profiled apertures defines said fuse links only around said one conductive via.

* * * * *